（12）United States Patent
Cohen et al.

(10) Patent No.: US 8,115,191 B2
(45) Date of Patent: Feb. 14, 2012

(54) SELF-CONSTRAINED ANISOTROPIC GERMANIUM NANOSTRUCTURE FROM ELECTROPLATING

(75) Inventors: Guy Cohen, Mohegan Lake, NY (US); Hariklia Deligianni, Tenafly, NY (US); Qiang Huang, Ossining, NY (US); Lubomyr T. Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/541,559

(22) Filed: Aug. 14, 2009

(65) Prior Publication Data

US 2009/0302305 A1 Dec. 10, 2009

Related U.S. Application Data

(62) Division of application No. 11/620,391, filed on Jan. 5, 2007, now Pat. No. 7,659,200.

(51) Int. Cl.
*H01L 21/302* (2006.01)
(52) U.S. Cl. ............ 257/9; 977/762; 438/478; 438/674; 257/E21.115; 257/E21.131; 257/E21.596
(58) Field of Classification Search ........ 257/9; 977/762
See application file for complete search history.

(56) References Cited

U.S. PATENT DOCUMENTS

| 2,690,422 | A | 9/1954 | Szekely |
| 5,270,229 | A | 12/1993 | Ishihara et al. |
| 2004/0127012 | A1* | 7/2004 | Jin .............................. 438/618 |
| 2006/0054881 | A1* | 3/2006 | Li et al. .......................... 257/19 |

FOREIGN PATENT DOCUMENTS

DE 19522054 11/1996

OTHER PUBLICATIONS

Sharma et al., "Optical Properties of Ge Nanowires Grown on Silicon (100) and (111) Substrates", Materials Research Society Symposium Proceedings, vol. 832, pp. 329-334, 2005.
Dailey et al., "Vapor-liquid-solid growth of germanium nanostructures on silicon", Journal of Applied Physics, vol. 96, No. 12, pp. 7556-7567, 2004.
Schuessler et al., "Electrochemical Deposition of Pd, Ti, and Ge for Applications in GaAs Technology", Journal of the Electrochemical Society, vol. 143, No. 4, pp. L73-L75, 1996.
Saitou et al., "Evaluation of crystalline germanium thin films electrodeposited on copper substrates from propylene glycol electrolyte", Surface and Coatings Technology, vol. 162, pp. 101-105, 2002.

\* cited by examiner

*Primary Examiner* — Jenny L Wagner
*Assistant Examiner* — Jami M Valentine
(74) *Attorney, Agent, or Firm* — Louis J. Percello, Esq.

(57) ABSTRACT

A nanostructure comprising germanium, including wires of less than 1 micron in diameter and walls of less than 1 micron in width, in contact with the substrate and extending outward from the substrate is provided along with a method of preparation.

8 Claims, 7 Drawing Sheets

FIG. 1A prior-art

FIG. 1B prior-art

FIG. 2A prior-art

FIG. 2B prior-art

FIG. 2C this disclosure

SELF-CONSTRAINED ANISOTROPIC GERMANIUM NANOSTRUCTURE FROM ELECTROPLATING

CROSS REFERENCE TO RELATED APPLICATIONS

The present application is divisional of co-pending application Ser. No. 11/620,391, filed on Jan. 5, 2007, which is related to co-pending U.S. patent application Ser. No. 11/620,224, filed on Jan. 5, 2007, entitled "Structures Containing Electrodeposited Germanium And Methods For Their Fabrication" and is assigned to International Business Machines Corporation, the assignee of the present application. The entire contents of each co-pending U.S. patent application is incorporated herein by reference for all purposes.

TECHNICAL FIELD

The field of the present disclosure relates to the nanostructure comprising germanium (Ge) nanowires. In particular, the present disclosure relates to electrodeposition of Ge onto patterned semiconductor substrates.

BACKGROUND

Nanowire field effect transistors would allow 3-dimensional integration and thus a much higher device density than the current technologies. The key element of such a device is the semiconductor nanowire. So far, nanowires of a few semiconductor compounds produced by electroplating have been reported. However, nanowires of Si and Ge have only been produced by vacuum processes.

Figure 1A:
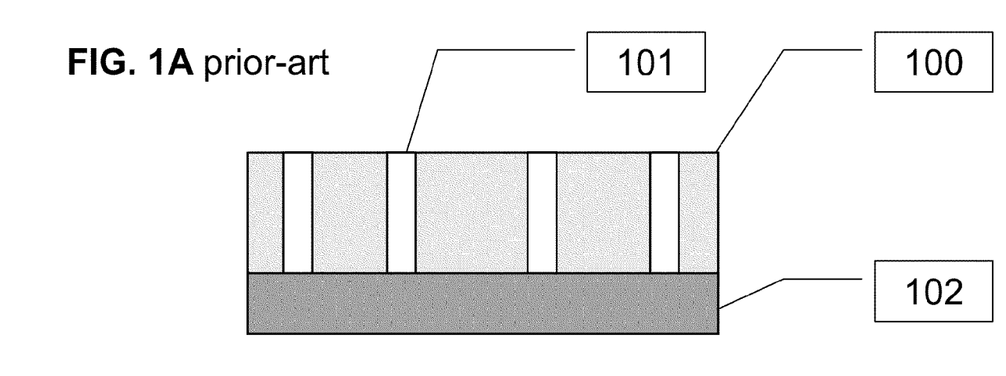
FIGS. 1A and 1B are schematic diagrams of prior art in electroplating metallic nanostructures.
Figure 1B:
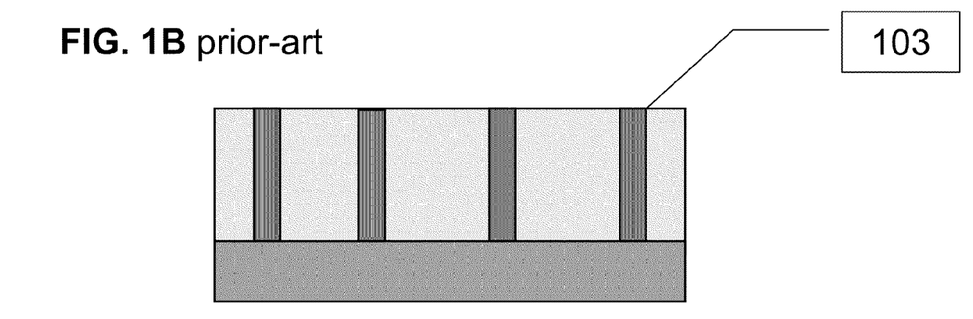

Moreover the previously reported nanowire structures made from electroplating are produced with a template, which defines the shape of the structures. As described in FIG. 1, the template (100) with nanopores (101) has a layer of conductive material (102) at one side, which carries the electroplating current and wire structures (103) are electroplated with the shape defined by the pores.

Germanium is a semiconducting material with higher mobility as compared to silicon. There have been some limited suggestions of electrodeposition of germanium onto metals. However, they have not been especially successful. These efforts may have not been thwarted due to the high reversible potential of Ge and the very low hydrogen overpotential on Ge surfaces. Therefore, all of the plating current can result from the proton reduction (side reaction) and no Ge plating can occur once the electrode surface is covered by Ge. So far, three approaches of Ge electroplating have been reported.

For instance, plating of germanium on metal substrates has been reported in alkaline aqueous solutions (see Fink et al., Journal of the Electrochemical Society, vol. 95, p. 80 (1948)) and in glycol solutions (see Szekely, Journal of the Electrochemical Society, vol. 98, p. 318 (1951) and U.S. Pat. No. 2,690,422 to Szekely). More recently, some studies have been reported directed nucleation studies in ionic liquid media. See Endres, Electrochemical and Solid State Letters, vol. 5, p. C38 (2002); Endres, Physical Chemistry and Chemical Physics, vol. 4, p. 1640 (2002) and Endres, Physical Chemistry and Chemical Physics, vol. 4, p. 1649 (2002).

In the aqueous solution approach, an extremely alkaline solution (pH>13) was suggested to minimize the proton concentration and therefore suppress the reduction of proton. This approach is not compatible with most microelectronics processes due to the extremely high pH of the electrolyte, which cause damages to most of the structures that are built from dielectrics such as silicon oxides.

In the non-aqueous solution approaches, where the glycol and ionic liquid solvents are used, the proton is either partially decreased or completely removed in the solution resulting in a much less side reaction. The techniques using ionic liquids suffer from the disadvantages of high viscosity and expenses.

Electroplating of germaniun on semiconductor substrates and especially on silicon has not been previously achieved, except as disclosed the co-pending US patent application entitled "Structures Containing Electrodeposited Germanium And Methods For Their Fabrication", which is assigned to the same assignee and which discloses a method to produce epitaxial Ge thin film on semiconductor substrates by electroplating and solid state epitaxy. In said patent application, a method to electroplate free standing Ge nano-structure without being constrained in a template is disclosed.

SUMMARY

The present disclosure relates to a nanostructure that comprises a semiconductor substrate, and comprises Ge in contact with the substrate. The Ge is less than 1 micron in at least one dimension. In one embodiment the Ge extends outwardly from its substrate.

The present disclosure also relates to a method for forming a Ge-containing nanostructure that comprises:
  obtaining a patterned semiconductor substrate,
  immersing the semiconductor substrate into a plating solution containing Ge,
  applying electrical potential between the semiconductor substrate and an anode in the plating solution whereby the patterned semiconductor substrate, wherein Ge is plated through the openings in the pattern.

The Ge is less than 1 micron in at least one dimension. In one embodiment the Ge extends outwardly from its substrate and the Ge is less than 1 micron in diameter.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the intent of this disclosure. Accordingly, the description is to be regarded as illustrative in nature and not as restrictive.

BEST AND VARIOUS MODES FOR CARRYING OUT DISCLOSURE

The present disclosure relates to providing germanium nanostructures on semiconductor substrates. Suitable semiconductor conductor substrates include but not limited to: Si-based and Ge-based semiconductors such as Si, Ge, SiGe alloys, SiC alloys, SiGeC alloys as well as III-V and II-VI semiconductors as well as any combinations of the above.

According to the present disclosure germanium nanostructures are electroplated onto patterned semiconductor substrates having insulating regions and semiconductor regions. The insulating regions can be formed from dielectrics such as silicon oxides, silicon nitrides and aluminum oxide.

The germanium can be electroplated directly onto the semiconductor substrate without any seed or intermediate layer such as a seed layer. If desired a seed layer such as copper or nickel layer can be deposited prior to the electroplating of the germanium. This seed layer can be formed prior to the fabrication of the dielectric stencil by standard deposition processes such as sputtering, evaporation, PVD and CVD. When present, the seed layer is typically about 10 to about 100 nanometers thick and more typically about 10 to about 20 nanometers thick. Other intermediate layer can also be deposited prior to the germanium plating by electrochemical deposition including electroless or electroplating techniques.

The electroplating bath typically employed according to the present disclosure contains a source of germanium ions such as germanium tetrahalide and especially germanium tetrachloride and an organic solvent such as an alkyl diol. Examples of alkyl diols are alkyl diols typically having 2-5 carbon atoms and including ethylene glycol, propylene glycol, 1,3 propanediol, butylene glycol, 1,3 butanediol and pentylene glycol. The concentration of the source of germanium is typically about 0.2 to about 0.7 moles and more typically about 0.3 to about 0.5 moles/liter; an example being about 0.5 mol/L GeCl$_4$. The components of the electroplating bath are desirably highly pure (>99.9%).

Figure 7:
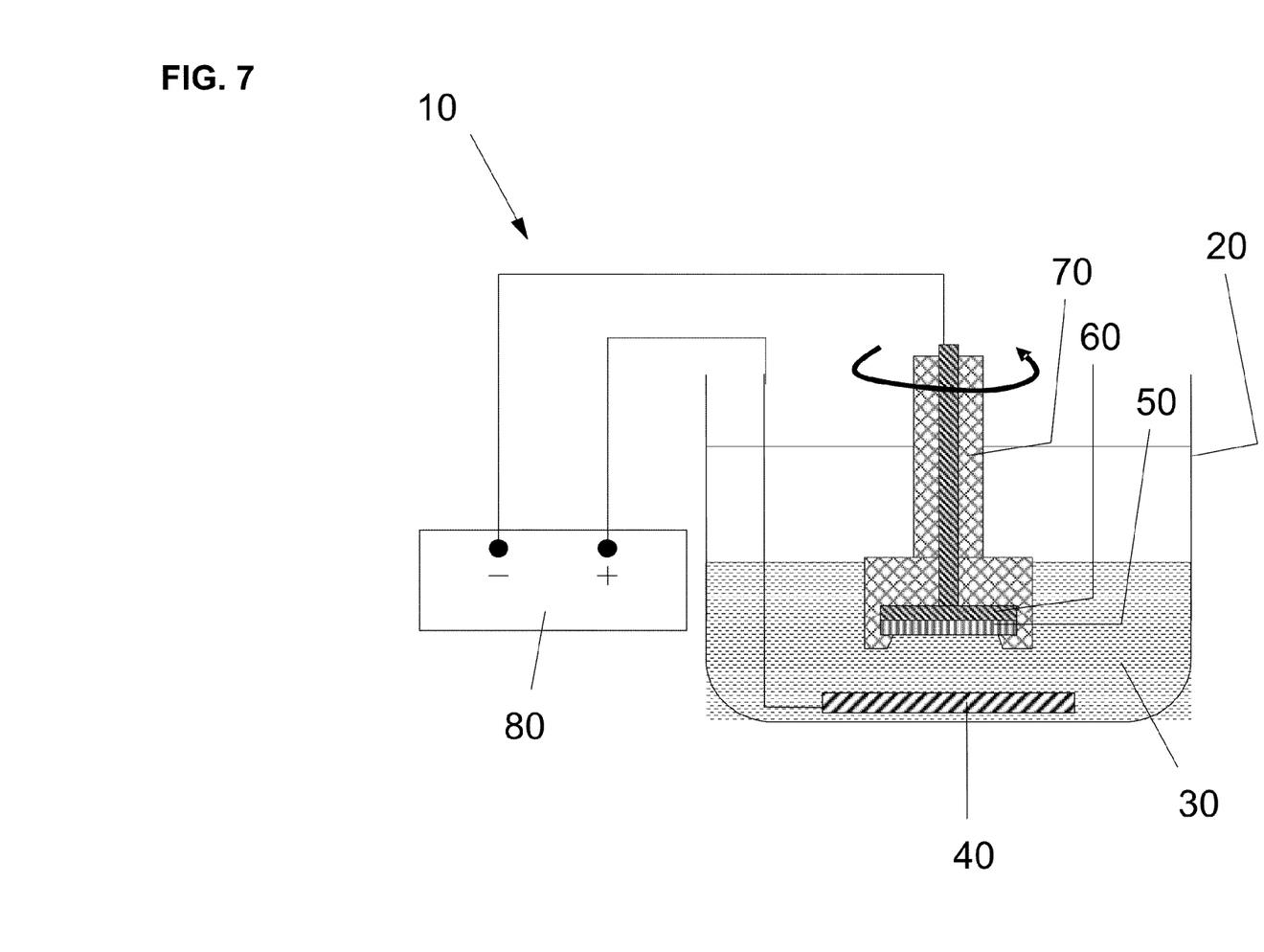
FIG. 7 shows a schematic representation of an exemplary apparatus for electrodepositing Ge on semiconductor wafer substrates.

FIG. 7 shows a plating apparatus 10 that may be used to implement the Ge electroplating of the present disclosure. Apparatus 10 comprises vessel 20 containing electrolyte 30 and stationary anode 40. Substrate 50 is mounted on rotating cathode 60 and immersed in electrolyte 30. Rotating cathode 60 and edges of substrate 50 are protected from the electrolyte by insulating housing 70. Power supply 80 supplies a current between anode 40 and substrate/cathode 50/60. A typical anode 40 is graphite.

The electrodeposition is typically carried out at temperature of about 50° C. to about 90° C. and more typically at about 70 to 80° C. The current density employed is typically about 2000 to about 8000 milliamps/cm$^2$. Prior to immersing the semiconductor substrate into the plating bath, the substrate is typically cleaned, such as by washing with a dilute HF solution (1:100). The plating both is typically aged such as for at least about 3 hours or in the alternative contains a small amount of water, e.g. about 0.5 g/L to about 2 g/L, a typical example being 1 g/L.

During plating the cathode rotates at a typical rate of about 500 rpm to about 2000 rpm with an example being about 1000 rpm. The electroplating is carried in a galvanostatic mode. The plating is carried out for sufficient time to provide germanium extending outwardly from the substrate typically to a length of about 0.1 µm to about 3 µm, more typically about 0.2 µm to about 1 µm.

Figure 2A:
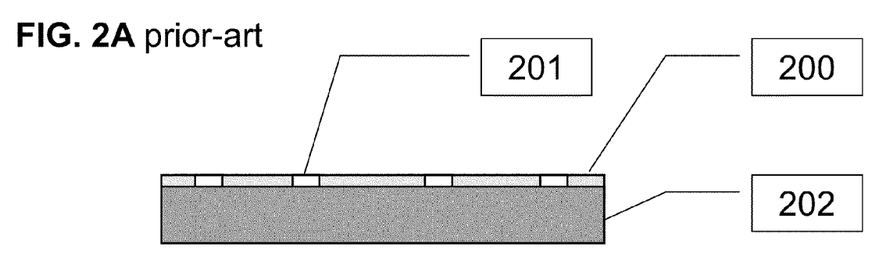
FIGS. 2A and 2B are schematic diagrams of prior art of a mushroom growth as is in most cases of electroplating through mask.
Figure 2B:
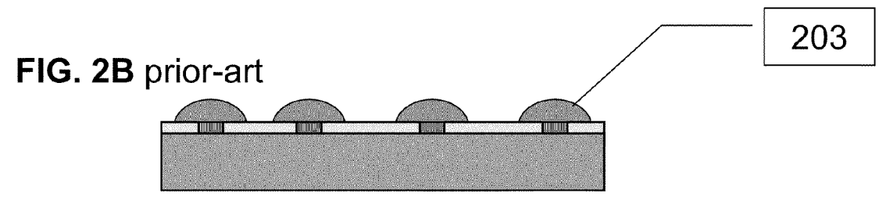
Figure 2C:
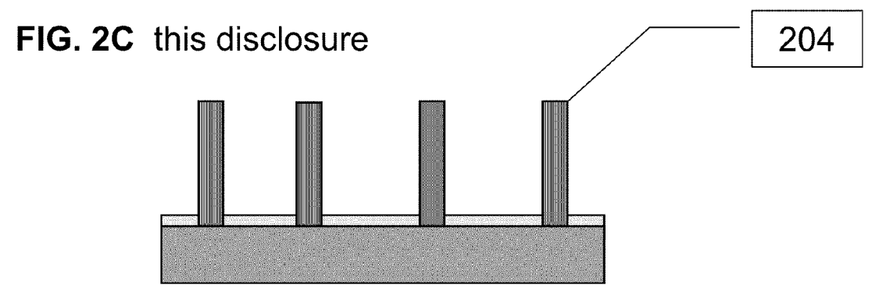
FIG. 2C is a schematic diagram of a nanostructure according to this invention.

As mentioned above, the present disclosure makes it possible to fabricate germanium nanowire structures without the use of template. The method of the present disclosure makes it possible to produce germanium nanowires by a self-constrained anistropic growth in the electroplating, completely different from a traditional template plating process. As described in FIG. 2, shallow patterns (200) with pores (201) are fabricated on a conductive or semi-conductive layer (202). Plating continues after the pores are filled. Instead of a mushroom cap (203) that occurs in most cases of electroplating, wire structures (204) are produced as they grow out of the pattern in an anisotropic manner maintaining the size defined by the pattern.

The following non-limiting examples are presented to further illustrate the present disclosure.

EXAMPLE 1

The electrolyte employed comprises a 0.5 mol/L solution of GeCl$_4$ in 1,3-propanediol. Both chemicals are highly pure and dry. The cathode is a patterned silicon having been pre-cleaned and patterned by standard microelectronics fabrication processes. A typical stack for patterning is prepared by depositing on silicon, about 10 nanometers thick of silicon dioxide and then, 20 nanometers thick silicon nitride. Features with 200 nanometers in dimension are patterned through silicon nitride and silicon dioxide with lithography and reactive ion etch processes. Immediately before the electroplating, the patterned silicon substrate is dipped in a 1:100 dilute HF for about 2 minutes to remove native oxide. InGa eutectic is applied on the backside of the silicon to form an ohmic contact, and the substrate is mounted on a rotating disk electrode as illustrated in FIG. 7.

The fresh GeCl$_4$ bath is aged by exposing to ambient conditions for at least 3 hours. The electrolyte is maintained at about 70-80° C. A graphite anode is used. The cathode rotates during plating at a typical rate of 1000 rpm. The electroplating is carried out in a galvanostatic mode and a current of about −4000 mA/cm2 is typically used for producing the nanostructure.

Figures 3A, 3B, 3C:
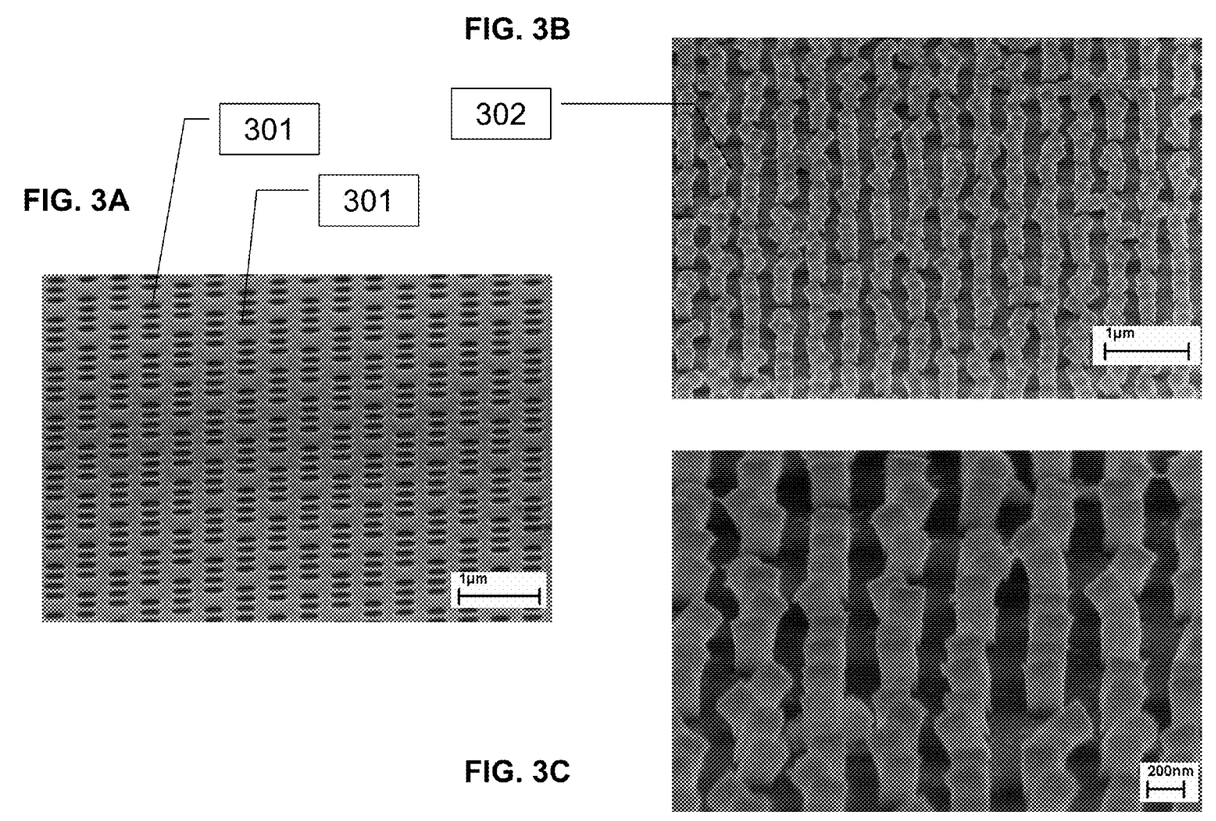
FIG. 3A is an electron microscope photograph of a patterned semiconductor substrate prior to plating according to the present disclosure.
FIGS. 3B and 3C are electron microscope photographs at different magnifications illustrating the germanium nanowires grown out of the patterned substrate of FIG. 3A.
Figure 4:
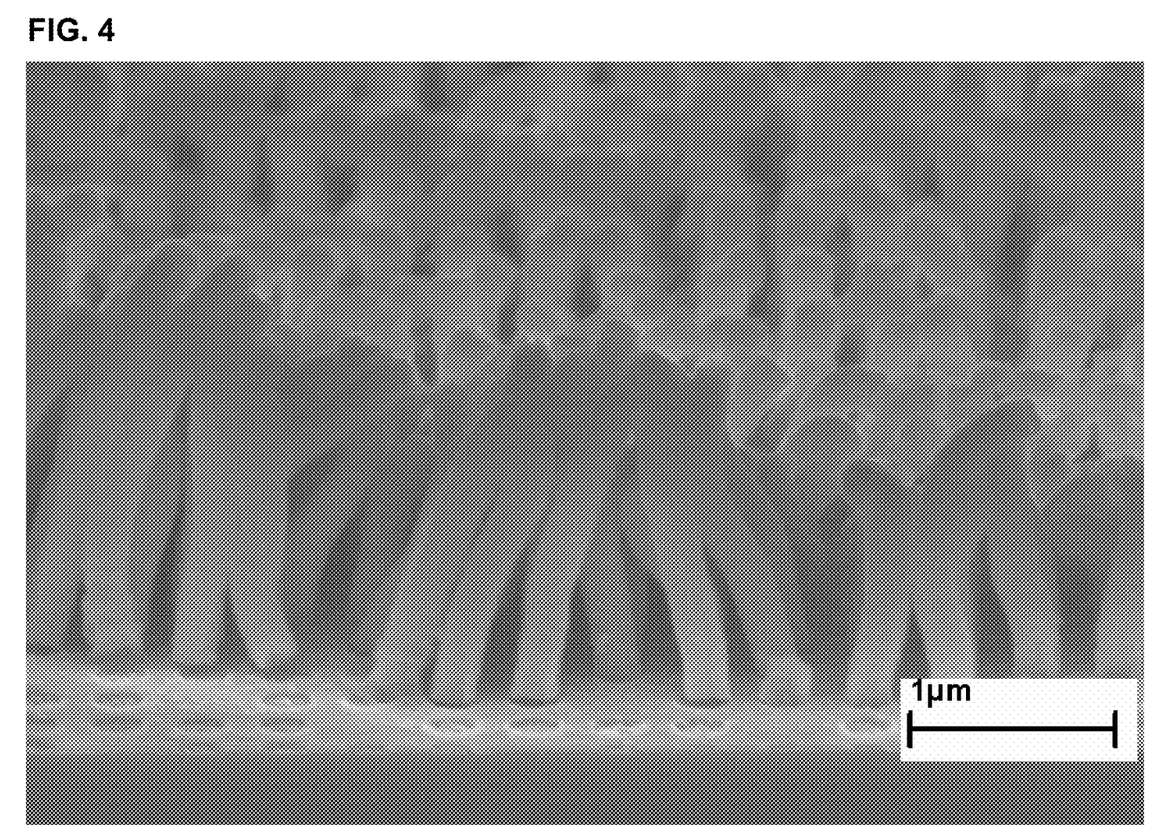
FIG. 4 is an electron microscope photograph illustrating germanium wires grown out of a patterned semiconductor substrate.
Figure 5:
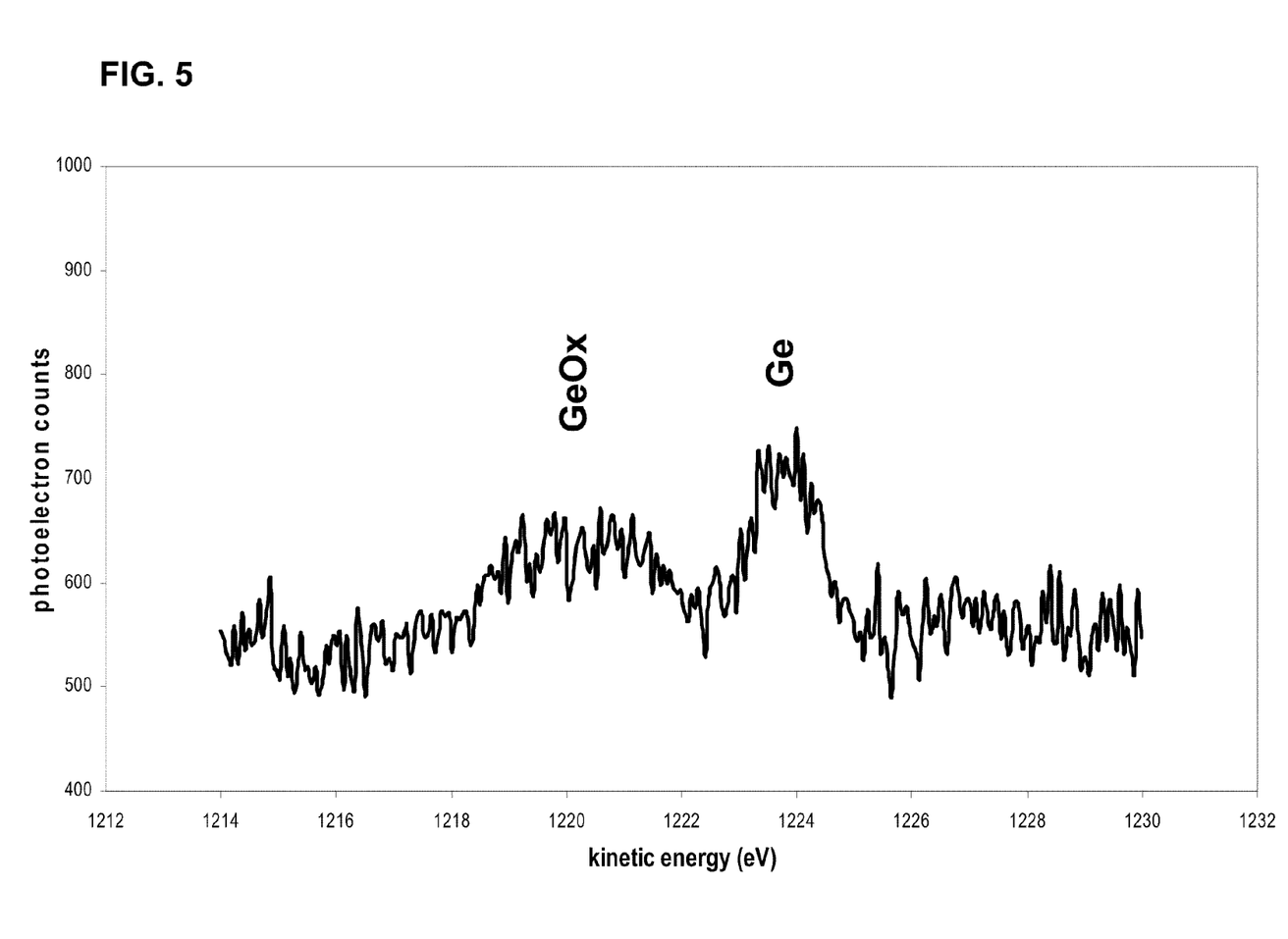
FIG. 5 shows Ge XPS analysis of a germanium nanowire electroplated according to the present disclosure. The two peaks are denoted as elemented germanium and germanium oxide.

FIGS. 3A and 3C show a typical example of the wire structure plated at a typical condition according to this example. FIG. 3A shows the pattern before plating, a stack (300) 10 nanometers silicon dioxide and then, 20 nanometers silicon nitride are deposited on the silicon. Vias of 200 nanometers diameter (301) are patterned with lithography and etching processes and the silicon substrate is exposed. The electroplated germanium nanowire structures (302) grow out of the pattern and maintain the diameter of the vias, 200 nm. (See FIGS. 3B-3C). FIG. 4 is a wire structure grown at the same conditions as FIG. 3, but for a longer time. Micconmeter-long wires are obtained with the shape still defined by the pattern.

Figure 6A:
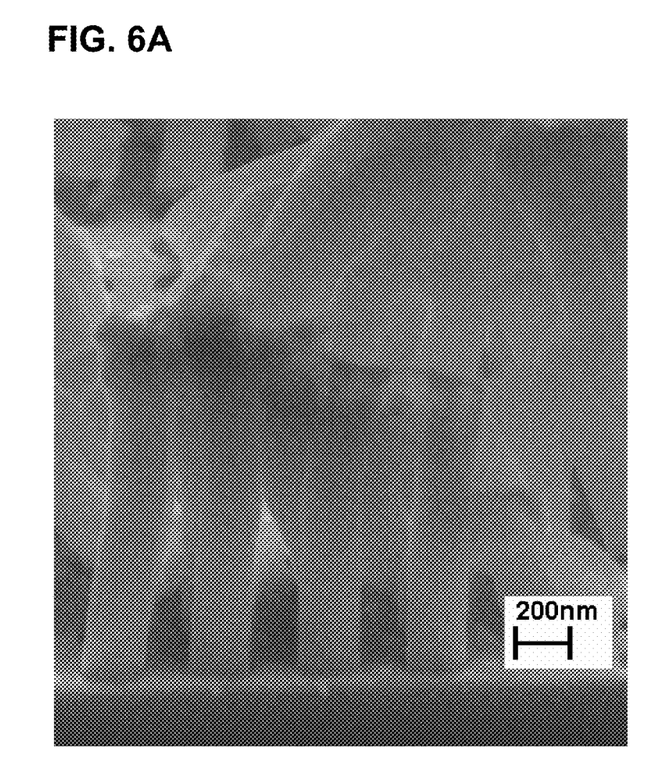
FIGS. 6A and 6B are electron microscope photographs illustrating germanium wire- and wall-shaped structures grown out of a patterned semiconductor substrate.
Figure 6B:
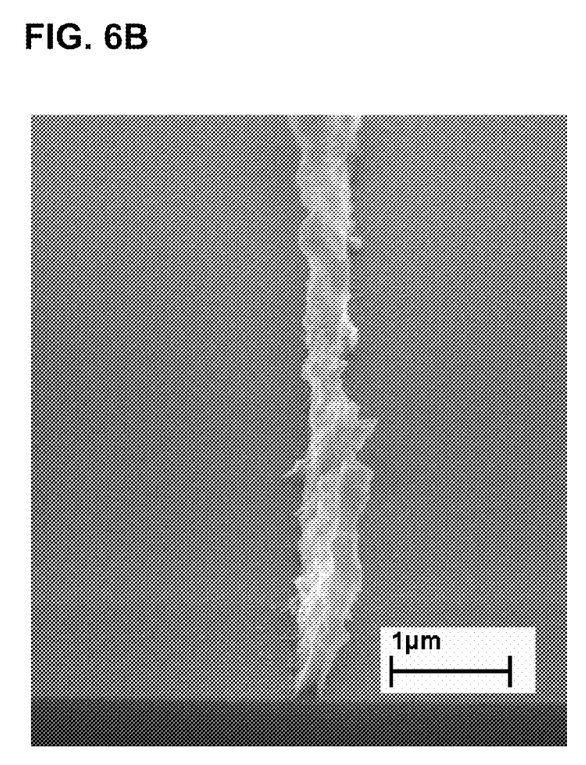

FIG. 6 shows the XPS analysis of a typical wire structure electroplated according to this example. Two peaks are denoted as elemental germanium and germanium oxide. The majority of the deposit is confirmed as germanium while the surface of the structure can be oxidized in the air.

EXAMPLE 2

The electrolyte employed comprises a 0.5 mol/L solution of GeCl$_4$ in 1,3-propanediol. Both chemicals are highly pure and dry. The cathode is a patterned silicon having been pre-cleaned and patterned by standard microelectronics fabrication processes. A typical stack for patterning is prepared by depositing on silicon, about 10 nanometers thick of silicon dioxide and then, 20 nanometers thick silicon nitride. Features with 200 nanometers in dimension are patterned through silicon nitride and silicon dioxide with lithography and reactive ion etch processes. Immediately before the electroplating, the patterned silicon substrate is dipped in a 1:100 dilute HF for about 2 minutes to remove native oxide. InGa eutectic is applied on the backside of the silicon to form an ohmic contact, and the substrate is mounted on a rotating disk electrode.

About 1 g/L of water is added to the fresh GeCl$_4$ bath. The electrolyte is maintained at about 70-80° C. A graphite anode is used. The cathode rotates during plating at a typical rate of 1000 rpm. The electroplating is carried out in a galvanostatic mode and a current of about −4000 mA/cm2 is typically used for producing the nanostructure.

FIGS. 7A and 7B show typical structures plated at a typical conditions according to this example, on via and stripe patterns. FIG. 7A shows that the electroplated germanium nanowire structures grow out of the via patterns and maintain the diameter of the vias, 200 nanometers. FIG. 7B is a wall structure grown at the same conditions in this example, but on a stripe pattern shown in FIG. 4B. The wall structures grow out of the stripe patterns and maintain the shape of the stripes, hundreds of micrometers in length and 200 nanometers in width.

The term "comprising" (and its grammatical variations) as used herein is used in the inclusive sense of "having" or "including" and not in the exclusive sense of "consisting only of". The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the invention and to enable others skilled in the art to utilize the disclosure in such, or other, embodiments and with the various modifications required by the particular applications or used disclosed herein. Accordingly, the description is not intended to limit the invention to the form disclosed herein. Also, it is intended that the appended claims be constructed to include alternative embodiments.

All publications, patents and patent applications cited in this specification are herein incorporated by reference, and for any and all purposed, as if each individual publication, patent or patent application were specifically and individually indicates to be incorporated by reference. In the case of inconsistencies, the present disclosure will prevail.

What is claimed is:

1. A nanostructure comprising
   a semiconductor substrate;
   a mask formed on the said substrate;
   an opening in said mask to expose said semiconductor substrate, wherein at least one dimension of said opening is less than 1 micron;
   a germanium structure in direct contact with said substrate and extending outwardly from said opening, wherein any cross section of said germanium taken parallel with said substrate mimics the shape of said opening, and
   wherein said germanium extending outwardly from said substrate forms a wall shaped structure with a width of about 100 to about 300 nanometers.

2. The nanostructure of claim 1 wherein said semiconductor substrate is selected from the group consisting of Si, Ge, SiGe, SiC, GeC, SiGeC, III-V materials, and II-VI materials and mixtures thereof.

3. The nanostructure of claim 1 wherein said substrate is selected from the group consisting of Si, Ge and GaAs.

4. The nanostructure of claim 1 wherein said substrate contains dielectric regions.

5. A nanostructure comprising
   a semiconductor substrate;
   a mask formed on the said substrate;
   an opening in said mask to expose said semiconductor substrate, wherein at least one dimension of said opening is less than 1 micron;
   a germanium structure in direct contact with said substrate and extending outwardly from said opening, wherein any cross section of said germanium taken parallel with said substrate mimics the shape of said opening, and
   wherein said germanium extending outwardly from said substrate forms a nanowire and wherein the germanium nanowire has a diameter of about 100 to about 300 nanometers.

6. The nanostructure of claim 5 wherein said semiconductor substrate is selected from the group consisting of Si, Ge, SiGe, SiC, GeC, SiGeC, III-V materials, and II-VI materials and mixtures thereof.

7. The nanostructure of claim 5 wherein said substrate is selected from the group consisting of Si, Ge and GaAs.

8. The nanostructure of claim 5 wherein said substrate contains dielectric regions.

* * * * *